(12) United States Patent
Decoutere et al.

(10) Patent No.: US 11,094,629 B2
(45) Date of Patent: Aug. 17, 2021

(54) 3D POWER DEVICE AND SYSTEM

(71) Applicant: IMEC VZW, Leuven (BE)

(72) Inventors: Stefaan Decoutere, Haasrode (BE); Steve Stoffels, Haasrode (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/726,120

(22) Filed: Dec. 23, 2019

(65) Prior Publication Data
US 2020/0203274 A1  Jun. 25, 2020

(30) Foreign Application Priority Data
Dec. 24, 2018  (EP) .................................... 18215846

(51) Int. Cl.
*H01L 23/522* (2006.01)
*H01L 21/768* (2006.01)
*H01L 23/48* (2006.01)
*H01L 23/64* (2006.01)
*H01L 29/20* (2006.01)
*H01L 21/8258* (2006.01)
*H01L 27/06* (2006.01)
(Continued)

(52) U.S. Cl.
CPC .... *H01L 23/5227* (2013.01); *H01L 21/76895* (2013.01); *H01L 23/367* (2013.01); *H01L 23/481* (2013.01); *H01L 23/528* (2013.01); *H01L 23/645* (2013.01); *H01L 29/2003* (2013.01)

(58) Field of Classification Search
CPC ........... H01L 21/76895; H01L 23/5227; H01L 23/645; H01L 23/367; H01L 23/481; H01L 23/528; H01L 29/2003
See application file for complete search history.

(56) References Cited

U.S. PATENT DOCUMENTS 9,105,560 B2   8/2015 Roberts et al.
2008/0303121 A1  12/2008 Lin et al.
(Continued)

FOREIGN PATENT DOCUMENTS

IN    1355/CHE/2015    3/2015

OTHER PUBLICATIONS

European Search Report, European Patent Application No. 18215846.9, dated Apr. 26, 2019, 9 pages.
(Continued)

*Primary Examiner* — Herve-Louis Y Assouman
(74) *Attorney, Agent, or Firm* — McDonnell Boehnen Hulbert & Berghoff LLP

(57) ABSTRACT

A three-dimensional (3D) power device having a plurality of layers that are stacked on top of each other and insulated from each other by interlayers, the plurality of layers comprising a lower layer comprising electrical and thermal conductors; a group III-Nitride based device layer formed above the lower layer, the group III-Nitride based device layer comprising at least one group III-Nitride based power device; a control layer formed above the group III-Nitride based device layer, the control layer comprising at least one control device; and a redistribution layer in between the group III-Nitride based device layer and the control layer, the current redistribution layer comprising a metal pattern being provided for laterally redistributing electrical currents and/or heat.

15 Claims, 3 Drawing Sheets

(51) Int. Cl.
*H01L 23/367* (2006.01)
*H01L 23/528* (2006.01)

(56) References Cited

U.S. PATENT DOCUMENTS

| | | | |
|---|---|---|---|
| 2011/0042820 A1* | 2/2011 | Knickerbocker | H01L 21/76898 257/774 |
| 2011/0195546 A1* | 8/2011 | Yang | H01L 24/24 438/118 |
| 2013/0120951 A1* | 5/2013 | Zuo | H01L 27/0688 361/783 |
| 2014/0054597 A1 | 2/2014 | Ritenour et al. | |
| 2014/0054604 A1 | 2/2014 | Ritenour | |
| 2014/0306332 A1* | 10/2014 | Denison | H01L 24/38 257/676 |
| 2016/0240471 A1 | 8/2016 | Klowak et al. | |
| 2018/0005988 A1 | 1/2018 | Deligianni et al. | |
| 2019/0393147 A1* | 12/2019 | Lin | H01L 23/53266 |

OTHER PUBLICATIONS

Raj, P M, et al., "3D Power Packaging Made Real With Embedded Component and Substrate Technologies", 3D Systems Packaging Research Center, Georgia Institute of Technology, PSMA Technology Report, 2018, 28 pages.

Gutierrez-Aitken, Augusto et al., Diverse Accessible Heterogeneous Integration (DAHI) at Northrop Grumman Aerospace Systems (NGAS), 2014 IEEE Compound Semiconductor Integrated Circuit Symposium (CSICS). IEEE, 2014, 4 pages.

Kazior, Thomas E., "Beyond CMOS: Heterogeneous Integration of III-V Devices, RF MEMS and Other Dissimilar Materials/Devices With Si CMOS to Create Intelligent Microsystems", Philosophical Transactions of the Royal Society A: Mathematical, Physical and Engineering Sciences, 372.2012 (2014): 20130105, 15 pages.

Benkart, Peter et al., "3D Chip Stack Technology Using Through-Chip Interconnects", IEEE Design & Test of Computers, IEEE CS and IEEE CASS, 2005, pp. 512-518.

* cited by examiner

3D POWER DEVICE AND SYSTEM

CROSS-REFERENCE TO RELATED APPLICATIONS

The present application is a non-provisional patent application claiming priority to European Patent Application No. 18215846.9, filed Dec. 24, 2018, the contents of which are hereby incorporated by reference.

FIELD OF THE DISCLOSURE

The present disclosure is directed, in general, to a power semiconductor device and, more specifically, to a three-dimensional (3D) power device having 3D integrated layers. The present disclosure further relates to a 3D power system.

BACKGROUND

In recent years, power electronic applications have been demanding small scale power devices and orders of magnitude increase in switching speeds. However, these requirements come with limitations such as high cost and inefficiency, particularly since the rate of improvement of Silicon based power devices and systems has slowed down.

To meet the requirements, materials are desired. Group III-Nitride based material technology, such as gallium nitride (GaN), has been widely demonstrated for electronic devices due to its low cost and superior scalability and is known for overcoming some of these limitations. Group III-Nitride based materials offer drastic reduction in energy consumption, reduction in size weight and cost and increase in power conversion performance. However, conventional technologies and methods have their limitations. Thus, better device architectures are required for power device technology.

3D power device architecture, based on 3D/vertical integration technology that allows for stacking of horizontal functional layers is known. Horizontal functional layers can be connected by vertical paths allowing for the interconnection of these layers. For example, such an architecture has been disclosed in Shrivastava Mayank (IN Pat. Appl. No. 1355/CHE/2015) for a 3D chip that can incorporate power devices, and in Roberts et al. (U.S. Pat. No. 9,105,560) for an electronic switching system and device, comprising driver circuits for GaN power transistors.

The interconnection of horizontal layers using vertical flows has allowed for the transfer of control signals for pulse width modulation, over-voltage protection, etc. Moreover, the vertical flows have allowed for the spreading of heat and to provide input and output connections to the 3D power device.

However, the increase in power conversion performance and faster switching operation forces has resulted in current crowding, where current density is crowded towards the slowest parts of the group III-Nitride based power device, which in turn degrades the overall device ruggedness. Furthermore, an electrical breakdown may occur vertically through the carrier substrate or circuit board due to the large lattice mismatch between the group III-Nitride based device and the carrier substrate or circuit board with group III-Nitride based devices that are fabricated on carrier substrate or circuit board.

SUMMARY

Embodiments of the present disclosure provide a 3D power device and system.

Additional and alternative embodiments of the disclosure may be understood from the following.

An aspect of the present disclosure provides a 3D power device having a plurality of layers that are stacked on top of each other and insulated from each other by interlayers. The plurality of layers comprises a lower layer, e.g. forming the layer of the 3D power device that is attached to a carrier or board, and comprising electrical conductors for conducting electrical currents and/or signals between the 3D power device and the carrier or board and thermal conductors for conducting heat from the 3D power device to the carrier or board; a group III-Nitride based device layer above the lower layer, the group III-Nitride based device layer comprising at least one group III-Nitride based power device; and a control layer above the group III-Nitride based device layer, the control layer comprising at least one control device for controlling the at least one group III-Nitride based power device.

The plurality of layers in the 3D power device further comprises a current and/or heat redistribution layer in between the group III-Nitride based device layer and the control layer, the current and/or heat redistribution layer comprising a metal pattern being provided for laterally redistributing electrical currents and/or heat. The high switching operation of group III-Nitride based power devices can result in a current density to crowd towards slow parts of the devices, which in turn can degrade the overall ruggedness of the devices. Furthermore, the heat dissipated by the power devices can reduce the overall performance of the power devices. The metal pattern may redistribute the current and/or heat flow in the current and/or heat redistribution layer and/or the group III-Nitride based device layer. By increasing the thickness of the metal pattern comprised in the current redistribution layer, higher total currents are allowed without compromising the power density. Furthermore, the metal pattern can further reduce the overheating of the power devices. As a result, this can improve the ruggedness of the group III-Nitride based power devices and the power devices can perform more efficiently.

In embodiments according to the present disclosure, the control layer may for example provide pulse width modulation and overvoltage protection to the at least one group III-Nitride based power device. As a result, the 3D power device can reduce problems that may occur in the at least one group III-Nitride based power device which can perform more reliably.

In embodiments according to the present disclosure, the plurality of layers may further comprise an inductor/transformer layer, which may comprise at least one inductor and/or transformer. The inductor and/or transformer may provide further functions in the 3D power device, such as storing power, transforming power, etc.

In embodiments according to the present disclosure, the 3D power device may further comprise a plurality of electrical interconnects for vertically conducting electrical currents and signals through the plurality of layers. The plurality of electrical interconnects can provide for current and/or signal flow between the plurality of layers in an efficient manner, such as through-wafer via, bumps, balls, etc. Therefore, the 3D power device may efficiently transfer electrical current and/or signals throughout the 3D power device. Furthermore, the 3D power device can achieve a compact form factor, and, thus, reduce manufacturing costs.

In embodiments according to the present disclosure, the 3D power device may further comprise a plurality of thermal interconnects for vertically conducting heat flow through relevant layers, and in some examples, at least from the group III-Nitride based device layer to the lower layer. The plurality of thermal interconnects can provide for heat flow between the relevant layers in an efficient manner, thereby reducing overheating of the relevant layers. Therefore, the 3D power device may provide reduced malfunctions and efficient performance. Furthermore, the 3D power device can achieve a compact form factor, and, thus, reduce manufacturing costs.

An aspect of the present disclosure also provides a 3D power system comprising at least one 3D power device as described herein.

An aspect of the present disclosure also provides a method for manufacturing a 3D power system, comprising the steps as described herein.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The following descriptions depict only example embodiments and are not considered limiting in scope. Any reference herein to the disclosure is not intended to restrict or limit the disclosure to exact features of any one or more of the example embodiments disclosed in the present specification.

Furthermore, the terms first, second, third and the like in the description and in the claims are used for distinguishing between similar elements and not necessarily for describing a sequential or chronological order. The terms are interchangeable under appropriate circumstances and the embodiments of the present disclosure may operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as example embodiments in which the present disclosure may be implemented rather than as limiting the scope of the disclosure.

The term "comprising", used in the claims, should not be interpreted as being restricted to the elements or steps listed thereafter; it does not exclude other elements or steps. It may be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Figure 11:
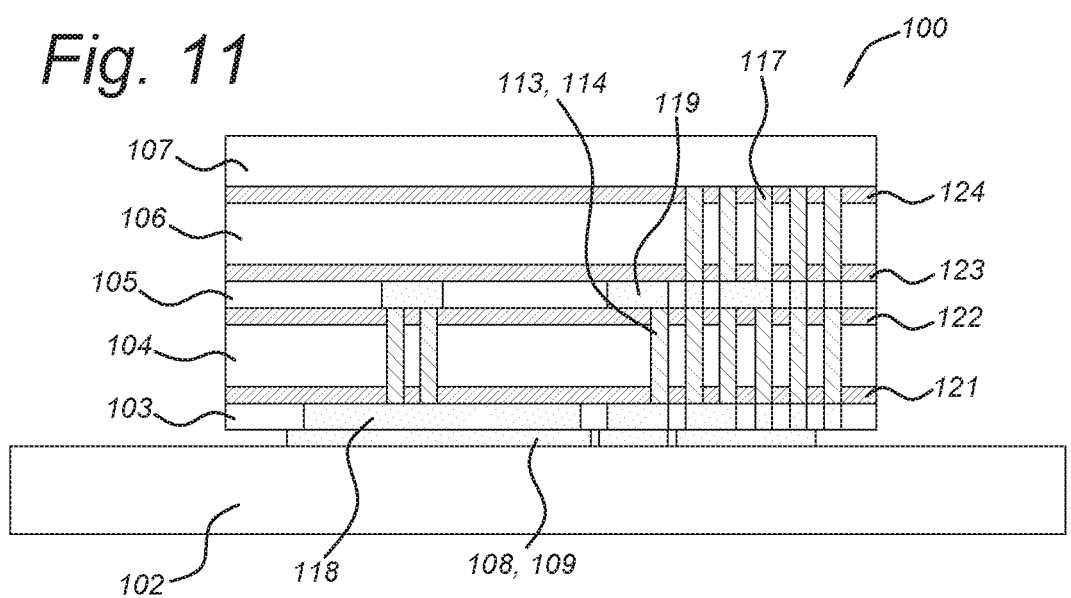
FIG. 11 depicts a cross-sectional view of a 3D power device according to an example embodiment.

A first embodiment of a 3D power device 100 according to the disclosure will be described with reference to FIG. 11. FIG. 11 shows a 3D power device 100 having a plurality of layers, which are stacked on top of each other and may be insulated from each other by interlayers 121-124. The plurality of layers will be discussed in further detail below.

The plurality of layers comprises a group III-Nitride based device layer 104. The group III-Nitride based device layer 104 comprises at least one group III-Nitride based power device. A group III-Nitride based device layer 104 may comprise III-Nitride based layers group III species and nitrogen. The group III species may include one or more element in group III of the Periodic Table, including B, Al, Ga, In, and Tl. The group III-Nitride based layers can be a compound that includes multiple Group III elements. The group III-Nitride based device layer 4 may comprise at least one group III-Nitride based power device including layers comprising binary compounds such as AlN, InN and GaN, ternary compounds such as $Al_xGa_{1-x}N$ ($0 \leq x \leq 1$) and $In_xGa_{1-x}N$ ($0 \leq x \leq 1$), quaternary compounds such as $In_xAl_yGa_{1-x-y}N$ ($0 \leq x,y \leq 1$), and quinary compounds such as $Ga_xIn_{(1-x)}As_yPSb_zNa_{(1-y-z)}$ ($0 \leq x,y,z \leq 1$). Throughout this disclosure, we refer to the group III-Nitride based device layer as a III-N device layer, and we refer to the group III-Nitride based power device as a III-N power device.

The at least one III-N power device may comprise solely or a combination of a thyristor, transistor, power diode, Schottky diode, rectifier, attenuator, switch, and invertor, wherein a rectifier may be a half-bridge rectifier, full-bridge rectifier, half-wave rectifier or full-wave rectifier. Furthermore, at least one III-N power device may be integrated vertically or laterally in the III-N device layer 104. Interconnecting III-N power devices, such as using interconnects to form a cascade, cascode, series and/or parallel connections, may be performed using known methods. Furthermore, the III-N device layer 104 may comprise at least one layer of which comprises one of the at least one III-N power device. Interconnecting the at least one III-N power device in the at least one layer comprised in the III-N device layer 104 are known, such as lateral interconnects, deep via, and/or other known methods.

The plurality of layers further comprises a lower layer 103 formed on the III-N device layer 104. The lower layer 103 may comprise an electrical conductor 118 for conducting electrical currents and/or signals between the 3D power device 100 and a carrier or board 102 and a thermal conductor 118 for conducting heat from the 3D power device 100 to the carrier or board 102. The carrier 102 may be conducting, such as Si or SiC, or insulating, such as, highly resistive bulk GaN, poly-AlN or $Al_2O_3$ where the insulation is supplied by buried oxide, or any other way known in the art for insulating the carrier 102. The board 102 may be flexible or non-flexible, and may be a wiring board or a printed circuit board. The process or combination of processes for attaching the lower layer 103 or the 3D power device 100 to the carrier or board 102 is known, such as dicing, soldering, flip chip, bumping technology, wafer-level packaging.

The lower layer 103 may further comprise an electric and/or heat insulating material, such as dielectric, fiber or any other insulating material. The lower layer 103 may further comprise a first conducting material in parts of the lower layer 103, provided for conducting electrical current, signals and/or heat flow through the lower layer 103. The first conducting material may be further provided for laterally distributing electrical current, signals and/or heat flow in the lower layer 103. The first conducting material may be solely one or a combination of a semiconductor such as doped silicon or a metal, such as copper, gold, aluminium, nickel, tin, etc. The first conducting material may be configured to form a first pattern (e.g., first metal pattern 118) that extends laterally and vertically through the lower layer 103. The first metal pattern 118 may further extend at least partially through the lower layer 103. The first metal pattern 118 may have a thickness in the range of 5-100 μm, in the range of 4-75 μm, or in the range of 4-50 μm. The first metal pattern 118 may comprise separate parts or patterns for conducting heat, electrical current and/or signals and, thus, may be provided with at least a portion for conducting heat from the power device 100 to the carrier or board (e.g. the larger portion shown in FIG. 11) and one or more portions for conducting electrical currents and/or signals between the III-N device layer 104 and the carrier or board 102 (e.g. the smaller portions shown in FIG. 11).

As shown in FIG. 11, the lower layer 103 may be formed on the carrier or board 102, by electrically connecting to an electrical conductor or contact 108 formed between the lower layer 103 and the carrier or board 102. The lower layer 103 may be formed on the carrier or board 102, by further connecting to a thermal conductor or contact 108 formed between the lower layer 103 and the carrier or board 102. As shown in FIG. 11, the first metal pattern 118 is at least partially electrically connected to the electrical conductor or contact 108, thereby allowing for electrical currents and/or signals to be transferred between the carrier or board 102 and the lower layer 103. The first metal pattern 118 may be further connected to the thermal conductor or contact 109, thereby allowing for heat to flow between the carrier or board 102 and the lower layer 103. Note that an electrical conductor or contact 108 may comprise one or more electrical conductors or contacts and a thermal conductor or contact 109 may comprise one or more thermal conductors or contacts.

As shown in FIG. 11, the lower layer 103 and the III-N device layer 104 may be stacked on top of each other and insulated from each other by a first interlayer 121, wherein the first interlayer 121 may be formed between the lower layer 103 and the III-N device layer 104.

The plurality of layers further comprises a redistribution layer 105 formed on top of the III-N device layer 104. The redistribution layer 105 may provide redistributing electrical current, signals and/or heat through the layer 105. The redistribution layer 105 may comprise an electric, magnetic and/or heat insulating material, such as dielectric, fiber or any other insulating material. The redistribution layer 105 may further comprise a conducting material at least in parts of the redistribution layer 105, provided for conducting electrical current, electrical signals, magnetic signals and/or heat flow through the redistribution layer 105. The conducting material, at least portions for redistributing electrical currents, may be solely one or a combination of a semiconductor such as doped silicon and a metal, such as copper, gold, aluminum, nickel, tin, etc. The conducting material, or portions thereof for redistributing heat, may be a metal, such as copper, gold, aluminum, nickel, tin, etc. The conducting material may be configured in the form of at least one pattern, for example, second metal pattern 119 that extends laterally and longitudinally through the redistribution layer 105.

As shown in FIG. 11, the redistribution layer 105 and the III-N device layer 104 may be stacked on top of each other and insulated from each other by a second interlayer 122, wherein the second interlayer 122 may be formed between the redistribution layer 105 and the III-N device layer 104. The redistribution layer 105 may be stacked on an opposite side of the III-N device layer 104 where the lower layer 103 may be formed or integrated.

The redistribution layer 105, in some examples via the at least one second metal pattern 119, is provided for laterally redistributing electrical current, signals and/or heat to and/or from the III-N device layer 104, in some examples to and/or from the at least one III-N devices. The electrical current, signals and/or heat may be further redistributed between the at least one III-N devices. The redistribution layer 105 is provided for redistributing the current and/or heat flow in the device 100, at least in lateral directions. The at least one second metal pattern 119 may have a thickness in the range of 4-50 μm, in the range of 4-40 μm, in the range of 4-30 μm, in the range of 4-20 μm or in the range of 4-15 μm. Thus, the current density can be limited to be less than the current density at which electro-migration occurs, such as a current density less than $10^7$ $A/cm^2$, in some examples less than $10^6$ $A/cm^2$ for a metal pattern comprising Cu, Au or Al. Furthermore, the temperature at any point in the power device can be limited to be less than a maximum temperature of 225° C., in some examples less than 150° C.

The plurality of layers further comprises a control layer 106. The control layer 106 may comprise at least one control device for controlling the gate voltage, providing overvoltage protection, providing pulse width modulation, reduction of ON resistance and/or reduction of feedback capacitance in the 3D power device 100. The at least one control device may comprise silicon or a group III-N based material as described above. The at least one control device and III-N power device may comprise similar or different material.

As shown in FIG. 11, the control layer 106 and the redistribution layer 105 may be stacked on top of each other and insulated from each other by a third interlayer 123, wherein the third interlayer 123 may be formed between the redistribution layer 105 and the control layer 106. The control layer 105 may be stacked on an opposite side of the redistribution layer 105 where the III-N device layer 104 may be formed. The control layer 106, in particular the at least one control device is provided for controlling the at least one III-N device comprised in the III-N device layer 104.

At least one of the interlayers 121-124 may comprise at least partially a thermally insulating material, wherein the interlayers 121-124 may be formed by glass frit, adhesive or other known methods. Furthermore, at least one of interlayers 121-124 may comprise at least partially electrically insulating material. Furthermore, at least one of the interlayers 121-124 may comprise at least partially a thermally and electrically insulating material. At least one of the interlayers 121-124 may further comprise at least partially an electromagnetic insulating material. Examples of material(s) comprised in the at least one of the interlayers 121-124 may be solely or a combination of glass, adhesive, epoxy, polycrystalline AlN, $Al_2O_3$, benzocyclobutene (BCB), silicon dioxide, doped silicon dioxide, polysilicon, amorphous silicon, hydrogen silsesquioxane (HSQ), silicon nitride, and group III-N compounds as described above, such as aluminium nitride (AlN), aluminium indium nitride (AlInN), titanium nitride (TiN), tantalum nitride (TaN), aluminium gallium nitride (AlGaN), etc. Other examples may comprise a metallic material, wherein the interlayers 121-124 may be formed by eutectic, thermo-compression, solder or other known methods. Furthermore, the interlayers 121-124 may comprise different or similar materials and may be formed using different or similar means. At least one of the interlayers 121-124 may be a bonding interlayer, wherein the bonding interlayer bonds two of the plurality of layers that are stacked on top of each other.

In embodiments, the 3D power device 100 may further comprise a passivation layer (not shown) formed on the control layer 106. The passivation layer may protect the plurality of layers comprised in the 3D power device from environmental influences, such as electrical and chemical contaminants. In some embodiments, the passivation layer may protect at least the control layer 106.

In embodiments, the 3D power device 100 may further comprise an inductor/transformer layer 107. The inductor/transformer layer 107 may comprise at least one inductor and/or transformer. The at least one inductor and/or transformer may comprise a silicon based or a group III-N based material as described above. Furthermore, the at least one inductor/transformer layer 107 may comprise a ferro-electric material, such as Lead Zirconate Titanate (PZT), Strontium Bismuth Tantalate (SBT), Bismuth Lanthanum Titanate (BLT) and Bismuth Neodymium Titanate (BNT), etc. The at least one inductor/transformer layer 107 may comprise a ferro-magnetic material, such as metal-metalloid alloys, for example, CoNiP, CoPtP, etc. The at least one inductor/transformer layer 107 may comprise a combination of ferro-electric and ferro-magnetic material. Furthermore, the at least one inductor and/or transformer and the at least one control device may comprise a material that is similar or different. The at least one inductor and/or transformer may be fabricated using known methods, such as MEMS fabrication with wafer-to-wafer bonding or die-to-wafer bonding.

As shown in FIG. 11, the inductor/transformer layer 107 and the control layer 106 may be stacked on top of each other and insulated from each other by a fourth interlayer 124, wherein the fourth interlayer 124 may be formed between the inductor/transformer layer 107 and the control layer 106. The inductor/transformer layer 107 may be stacked on an opposite side of the control layer 106 where the III-N device layer 104 and/or the redistribution layer 105 may be formed. In embodiments, the inductor/transformer layer 107 may be at least partly integrated in the control layer 106, wherein at least one control device may be formed in the inductor/transformer layer 107 or at least one inductor and/or transformer may be formed in the control layer 106.

In embodiments, a passivation layer (not shown) may be formed on the inductor/transformer layer 107. The passivation layer may protect the at least the inductor/transformer layer 107 from environmental influences, such as electrical and chemical contaminants.

As shown in FIG. 11, the 3D power device 100 may further comprise at least one of a plurality of electrical interconnects 213, 217 for vertically conducting electrical current and/or signals through at least one of the III-N device layer 104, redistribution layer 105, control layer 106 and the inductor/transformer layer 107. The first electrical interconnect 113 may extend through at least the III-N device layer 104 and may vertically conduct electrical current and/or signals through the III-N device layer 104. The first electrical interconnect 113 may further extend through at least one of the first and second interlayers 121, 122, (e.g., extending through both the first and second interlayers 121, 122) and may vertically conduct electrical current and/or signals through the III-N device layer 104 and at least one of the first and second interlayers 121, 122, (e.g., through the III-N device layer 104 and both the first and second interlayers 121, 122). The first electrical interconnect 113 may further vertically conduct electrical current and/or signals to the at least one III-N device comprised in the III-N device layer 104. Furthermore, the first electrical interconnect 113 may interconnect the at least one III-N device. Note that the first electrical interconnect 113 may comprise one or more electrical interconnects.

Furthermore, the first electrical interconnect 113 may further extend to the lower layer 103. Thus, the first electrical interconnect 113 may be electrically connected to the lower layer 103 and, in some examples, to at least the first metal pattern 118. The first electrical interconnect 113 may further electrically conduct electrical current and/or signals between the III-N device layer 104 and the lower layer 103. Thus, the III-N device layer 104 may be electrically connected to the carrier or board 102 via the first electrical interconnect 113, the first metal pattern 118 and the electrical conductors or contacts 108. The III-N device layer 104 may be electrically connected to the carrier or board 102 via second electrical interconnects (215 shown in FIG. 12), as will be discussed further below. Furthermore, the first electrical interconnect 113 may further extend to the redistribution layer 105. Thus, the first electrical interconnect 113 may further be electrically connected to the redistribution layer 105, for example, to the second metal pattern 119. The first electrical interconnect 113 may electrically conduct electrical current and/or signals between the III-N device layer 104 and the redistribution layer 105. Therefore, the first electrical interconnect 113 may vertically conduct electrical current and/or signals between at least two of the III-N device layer 104, the lower layer 103 and the redistribution layer 105.

Furthermore, the redistribution layer 105, (e.g., the second metal pattern 119), in combination with the first electrical interconnect 113 may redistribute electrical current and/or signals to and/or from at least one of the lower layer 103 and the III-N device layer 104. The redistributed electrical current and/or signals may be redistributed between the lower layer 103 and the at least one III-N device.

The third electrical interconnect 117 may extend through at least the control layer 106 and may vertically conduct electrical current and/or signals through the control layer 106. The third electrical interconnect 117 may further extend through at least one of the third and fourth interlayers 123, 124. Thus, the third electrical interconnect 117 may conduct electrical current and/or signals through the control layer 106 and at least one of the third and fourth interlayers 123, 124. The third electrical interconnect 117 may vertically conduct electrical current and/or signals to the at least one control device comprised in the control layer 106. Furthermore, the third electrical interconnect 117 may interconnect the at least one control device. The third electrical interconnect 117 and the second metal pattern 119 may be electrically connected in the third interlayer 127. Thus, the third electrical interconnect 117 may vertically conduct electrical current and/or signals through the redistribution layer 105. Furthermore, the third electrical interconnect 117 may provide vertically conducting electrical current and/or signals through the inductor/transformer layer 107. Thus, the third electrical interconnect 117 may further be electrically connected to the at least one inductor and/or transformer. The inductor/transformer layer 107 may further be electrically connected to the redistribution layer 105 and in some examples, the at least one inductor and/or transformer may be further electrically connected to the second metal pattern 119. Therefore, the third electrical interconnect 117 may vertically conduct electrical current and/or signals between at least two of the control layer 106, the redistribution layer 105 and the inductor/transformer layer 107. Furthermore, the control layer 106, (e.g., the at least one control device) may control the at least one inductor and/or transformer comprised in the inductor/transformer layer 107. Note that the third electrical interconnect 117 may comprise one or more electrical interconnects.

Furthermore, as the second metal pattern 119 may be electrically connected to the first interconnect 113, thus, the control layer 106 may be further electrically connected to the III-N device layer 104, (e.g., to the at least one control device) may be electrically connected to the at least one III-N device. Thus, the first and third interconnect 113, 117 and the second metal pattern 119 may vertically conduct electrical current and/or signals through the III-N device layer 104, the redistribution layer 105 and the control layer 106.

As shown in FIG. 11, the 3D power device 100 may further comprise a first thermal interconnect 114. The first thermal interconnect 114 may extend through at least the III-N device layer 104 and may vertically conduct heat through the III-N device layer 104. The first thermal interconnect 114 may further extend through at least one of the first and second interlayers 121, 122, in some examples extending through both the first and second interlayers 121, 122, and may vertically conduct heat through the III-N device layer 104 and at least one of the first and second interlayers 121, 122, (e.g., through the III-N device layer 104) and both the first and second interlayers 121, 122. The first thermal interconnect 114 may vertically conduct heat from the at least one III-N device comprised in the III-N device layer 104. Note that the first thermal interconnect 114 may comprise one or more thermal interconnects.

Furthermore, the first thermal interconnect 114 may further extend to the lower layer 103. Thus, the first thermal interconnect 114 may be connected to the lower layer 103, in some examples to the first metal pattern 118. The first thermal interconnect 114 may vertically conduct heat between the III-N device layer 104 and the lower layer 103. Thus, the III-N device layer 104 may be connected to the carrier or board 102 via the first thermal interconnect 114, the first metal pattern 118 and the thermal conductor 109. Furthermore, the first thermal interconnect 114 may further extend to the redistribution layer 105. Thus, the first thermal interconnect 114 may be further connected to the redistribution layer 105, in some examples to the second metal pattern 119. The first thermal interconnect 114 may conduct heat between the III-N device layer 104 and the redistribution layer 105. Therefore, the first thermal interconnect 114 may vertically conduct heat between at least two of the III-N device layer 104, the lower layer 103 and the redistribution layer 105.

In embodiments, at least one of the electrical and thermal conductors or contacts 108, 109 and electrical and thermal interconnects 113-117 may comprise one or more metals, such as copper, gold, aluminum, nickel, tin, etc.

Figure 12:
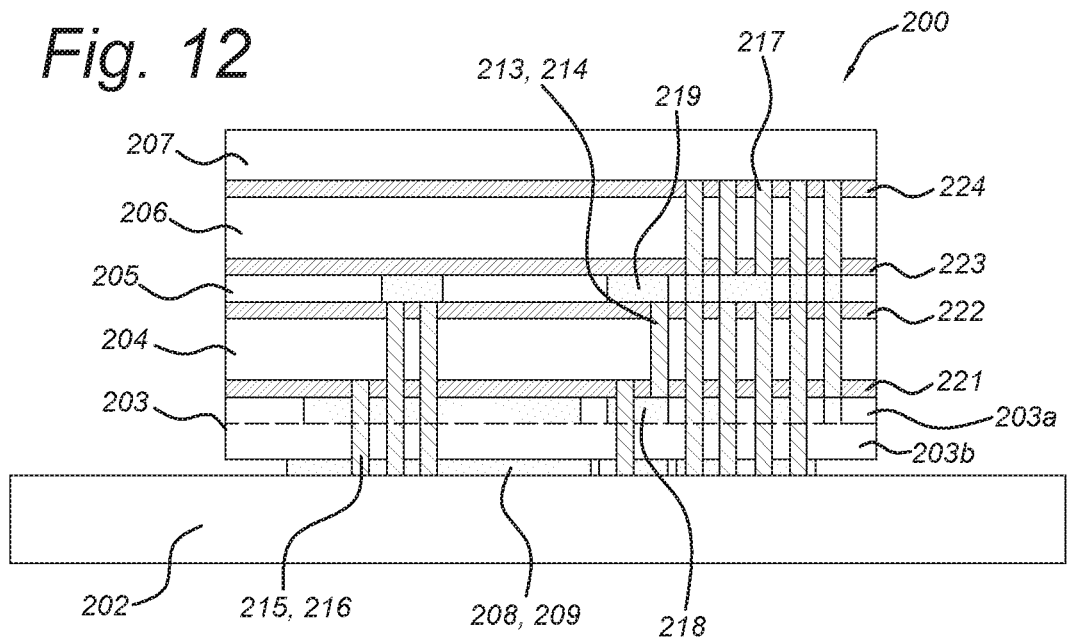
FIG. 12 depicts a cross-sectional view of a 3D power device according to an example embodiment.

A second embodiment of a 3D power device 200 according to the disclosure will be described with reference to FIG. 12. FIG. 12 shows a 3D power device 200, which corresponds in many aspects and/or features to the 3D power device 100 of the first embodiment of FIG. 11, therefore, only the differences will be described here for the sake of brevity. The 3D power device 200 may further comprise a second electrical interconnect 215 for vertically conducting electrical current and/or signals through at least one of the plurality of layers.

As shown in FIG. 12, the second electrical interconnect 215 may extend through at least a first part of the lower layer 203, in some examples further through the second part of the lower layer 203b, and may vertically conduct electrical current and/or signals through the lower layer 203. The second electrical interconnect 215 may further extend to the carrier or board 202 and may vertically conduct electrical current and/or signals through the lower layer 203 and the carrier or board 202, in particular to an electrical conductor or contact 208 on the carrier or board. The second electrical interconnect 215 may be further electrically connected to the first metal pattern 218 which may be formed in the first part of the lower layer 203a and may conduct electrical current and/or signals vertically and laterally through the lower layer 203. Thus, the carrier or board 202 may be electrically connected to the first metal pattern 218. Note that the second electrical interconnect 215 may comprise one or more electrical interconnects.

Furthermore, the second electrical interconnect 215 may further extend through the first interlayer 221 and may vertically conduct electrical current and/or signals through the lower layer 203 and the first interlayer 221. The second electrical interconnect 215 may electrically connect to the III-N device layer 204. Thus, the second electrical interconnect 215 may vertically conduct electrical current and/or signals between the carrier or board 202 and the III-N device later 204. Therefore, the second electrical interconnect 215 may vertically conduct electrical current and/or signals between at least two of the lower layer 203, the III-N device layer 204 and the carrier or board 202.

The first and second electrical interconnects 213, 215 may be electrically connected in the first interlayer 221. Thus, the first and second electrical interconnects 213, 215 may vertically conduct electrical current and/or signals through the lower layer 203 and the III-N device layer 204. Furthermore, the first and second electrical interconnects 213, 215 may vertically conduct electrical current and/or signals between the carrier or board 202 and at least one of the lower layer 203 and the III-N device layer 204. Furthermore, as the first electrical interconnect 213 may further be electrically connected to the second metal pattern 219, the lower layer 203 may be further electrically connected to the redistribution layer 205. Thus, the lower layer 203 may be further electrically connected to the first interconnect 213 and/or the second metal pattern 219. Therefore, the first and second electrical interconnects 213, 215 may vertically conduct electrical current and/or signals between at least two of the lower layer 203, the III-N device layer 204, the redistribution layer 205 and the carrier or board 202.

Furthermore, the redistribution layer 205, such as the second metal pattern 219, in combination with the first and second electrical interconnect 213, 215 may redistribute electrical current and/or signals to and/or from at least one of the lower layer 203, the III-N device layer 204 and the carrier or board 202. The redistributed electrical current and/or signals may be redistributed between the at least one III-N device and at least one of the lower layer 203 and the carrier or board 202.

Furthermore, as the first interconnect 213 may be electrically connected to the second electrical interconnect 215, the control layer 206 may be further electrically connected to the lower layer 203. Thus, the control layer 206 may be further electrically connected to the second electrical interconnect 215 and/or the first metal pattern 218. Furthermore, the first, second and third electrical interconnects 213, 215, 217 and the first and second metal pattern 218, 219 may vertically conduct electrical current and/or signals through the III-N device layer 204, the redistribution layer 205 and the control layer 206. Furthermore, the first and second electrical interconnects 213, 215 may vertically conduct electrical current and/or signals between the carrier or board 202 and at least one of the lower layer 203 and the III-N device layer 204. Therefore, the second electrical interconnect 215 may vertically conduct electrical current and/or signals between any of the lower layer 203, the III-N device layer 204 and the carrier or board 202. Furthermore, in some examples the control layer 206, (e.g., the at least one control device) may control at least one of the at least one inductor and/or transformer and the at least one III-N device.

As shown in FIG. 12, the 3D power device 200 may further comprise at least one of a plurality of thermal interconnects 214, 216 for vertically conducting heat through at least one of the plurality of layers. A second thermal interconnect 216 may extend through at least the lower layer 203 and vertically conduct heat through the lower layer 203. The second thermal interconnect 216 may further extend to the carrier or board 202 and may provide vertically conducting heat through the lower layer 203 and the carrier or board 202. The second thermal interconnect 216 may be further connected to the first metal pattern 218 thereby vertically and laterally conducting heat through the lower layer 203. Note that the second thermal interconnect 216 may comprise one or more thermal interconnects.

Furthermore, the second thermal interconnect 216 may further extend through the first interlayer 221 and may provide vertically conducting heat through the lower layer 203 and the first interlayer 221. The second thermal interconnect 216 may connect to the III-N device layer 204. Thus, the second thermal interconnect 216 may vertically conduct heat between the carrier or board 202 and the III-N device later 204. Therefore, the second thermal interconnect 216 may vertically conduct heat between at least two of the lower layer 203, the III-N device layer 204 and the carrier or board 202.

Furthermore, the redistribution layer 205 (e.g., the second metal pattern 219), in combination with the first thermal interconnect 214 may be redistribute heat to and/or from at least one of the lower layer 203 and the III-N device layer 204. The redistributed heat may be redistributed between the lower layer 203 and the at least one III-N device.

The first and second thermal interconnects 214, 216 may be connected in the first interlayer 221. Thus, the first and second thermal interconnects 214, 216 may vertically conduct heat through the lower layer 203 and the III-N device layer 204. Furthermore, the first and second thermal interconnects 214, 216 may vertically conduct heat between the carrier or board 202 and at least one of the lower layer 203 and the III-N device layer 204. Furthermore, as the first thermal interconnect 213 may further be connected to the second metal pattern 219, the lower layer 203 may be further connected to the redistribution layer 205. Thus, the lower layer 203 may be further connected to the first thermal interconnect 214 and/or the second metal pattern 219. Therefore, the first and second thermal interconnects 214, 216 may vertically conduct heat between at least two of the lower layer 203, the III-N device layer 204, the redistribution layer 205 and the carrier or board 202.

Furthermore, the redistribution layer 205, (e.g., the second metal pattern 219), in combination with the first and second thermal interconnect 214, 216 may redistribute heat to and/or from at least one of the lower layer 203, the III-N device layer 204 and the carrier or board 202. The redistributed heat may be redistributed between the at least one III-N device and at least one of the lower layer 203 and the carrier or board 202.

In embodiments, the 3D power device may comprise any combination of the electrical and/or thermal interconnects 213-217 for vertical conduction of electrical currents, signals and/or heat and metal patterns 218, 219 for lateral conduction of electrical currents, signals and/or heat.

In embodiments, at least one of the electrical interconnects 213, 215, 217 and the thermal interconnects 214, 216 may be solely or a combination of through-wafer via and bumps, and/or the second electrical and/or thermal interconnects 215, 216 may be solely or a combination of through-wafer via and bumps. Bumps may comprise solely or a combination of solder, gold stud bump, conductive epoxy, solder balls, copper balls, gold balls, copper columns, gold columns, copper pillar bumps, and copper posts. As known in the art, bumps may be formed by evaporation, plating, solder screening, etc. The bumps may be formed in an encapsulation layer which may protect the bumps from exposure to detrimental environmental conditions such as moisture, dust, corrosive atmospheres or even the oxygen in the surrounding air. The encapsulation layer may be further provided strengthening the bumps. As shown in FIG. 12, the encapsulation layer may be at least partially formed in the second part of the lower layer 203b.

In embodiments, interconnect bumps may be connected to at least one of the electrical and/or thermal interconnects 213-217. For example, the second electrical and/or thermal interconnects 215, 216 may be a combination of through-wafer via and bumps formed through the lower layer 203, wherein at least one of the through-wafer via and bumps may be connected to the electrical and/or thermal conductors or contacts 208, 209. The through-wafer via and bumps may be further connected to each other. In another example, interconnect bumps may be formed in between the III-N device layer 204 and the redistribution layer 205. The interconnect bumps may vertically conduct electrical current, signals and/or heat between the III-N device layer 204 and the redistribution layer 205. Furthermore, the interconnect bumps may connect to the electrical and thermal interconnects 213, 214 in the III-N device layer 204 and the second metal pattern 219 in the redistribution layer 205. Other examples may comprise interconnect bumps which may electrically connect to the redistribution layer 205 and the control layer 206, wherein the interconnect bumps may connect to the second metal pattern 219 and the electrical interconnect 217; interconnect bumps which may connect to the lower layer 203 and the III-N device layer 204, wherein the interconnect bumps may connect to at least one of the first electrical and thermal interconnects 213, 214, the second electrical and thermal interconnects 215, 216 and the first metal pattern 218.

Embodiments of a process flow for manufacturing 3D power devices according to the present disclosure, e.g. the devices 100, 200 of FIGS. 11-12, will be described with reference to FIGS. 1-10.

Figure 1:
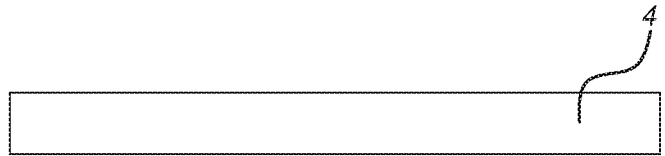
FIG. 1 depicts a schematic diagram of a process flow for manufacturing a 3D power device, according to an example embodiment.

FIG. 1 schematically shows a III-N device layer 4 (in the finished 3D power devices 100, 200, this corresponds to III-N device layers 104, 204), which typically comprises a III-N stack on a substrate (not shown) and one or more passivation layers (not shown) for protection of the III-N stack. The III-N device layer 4 comprises at least one group III-Nitride based power device.

Figure 2:
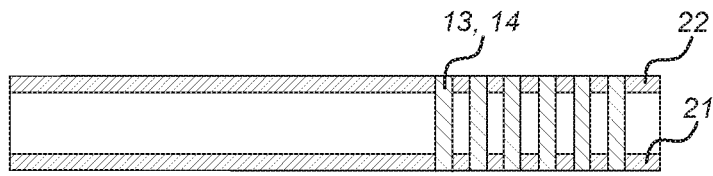
FIG. 2 depicts a schematic diagram of a process flow for manufacturing a 3D power device, according to an example embodiment.

FIG. 2 schematically shows the step of forming first and second interlayers 21, 22 (in the finished 3D power devices 100, 200, this corresponds to first interlayers 121, 221 and second interlayers 122, 222) on opposite faces of the III-N device layer 4. First electrical and/or thermal interconnects 13, 14 (in the finished 3D power device 200, this corresponds to first electrical interconnects 213 and first thermal interconnects 214) may be formed through at least the III-N device layer 4, and in some examples further through the first and second interlayers 21, 22. The interconnects 21, 22 may be formed by through-wafer via technology or other known methods.

Figure 3:
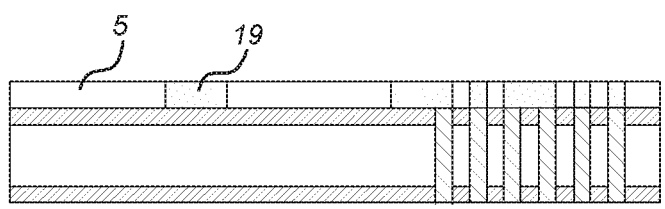
FIG. 3 depicts a schematic diagram of a process flow for manufacturing a 3D power device, according to an example embodiment.

FIG. 3 schematically shows the step of forming a redistribution layer 5 (in the finished 3D power devices 100, 200, this corresponds to redistribution layers 105, 205) on the structure of FIG. 2, such that the second interlayer 22 bonds the redistribution layer 5 to the III-N device layer 4. The redistribution layer 4 may comprise one or more second metal patterns 19 (in the finished 3D power devices 100, 200, this corresponds to second metal patterns 119, 219), e.g. at least one metal pattern for redistributing heat and at least one metal pattern for redistributing current, or one or more metal patterns for redistributing both heat and current. The second metal pattern(s) 19 may be formed by etching a pattern and forming a metal material therein. Furthermore, the respective metal pattern(s) 19 may be connected to the first electrical and/or thermal interconnects 13, 14.

Figure 4:
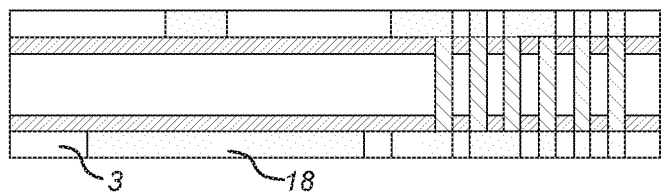
FIG. 4 depicts a schematic diagram of a process flow for manufacturing a 3D power device, according to an example embodiment.

FIG. 4 schematically shows the step of forming a lower layer 3 (in the finished 3D power devices 100, 200, this corresponds to lower layers 103, 203) is formed on the structure of FIG. 3, such that the first interlayer 21 bonds the lower layer 3 to the III-device layer 4. The lower layer 3 may comprise one or more first metal patterns 18 (in the finished 3D power devices 100, 200, this corresponds to first metal patterns 118, 218), e.g. at least one metal pattern for conducting heat and at least one metal pattern for conducting current. The metal pattern(s) 18 may be formed by etching a pattern and forming a metal material therein. Furthermore, the first metal pattern(s) 18 may be connected to the first electrical and/or thermal interconnects 13, 14. The metal patterns 18, 19 may be connected to the first electrical and/or thermal interconnects 13, 14. Further, second electrical and/or thermal interconnects (not shown, in the finished 3D power device 200, this corresponds to second electrical interconnects 215 and first thermal interconnects 216) may be formed in the lower layer 3. The interconnects may be formed by through-wafer via technology, bumping technology or known methods.

Figure 5:
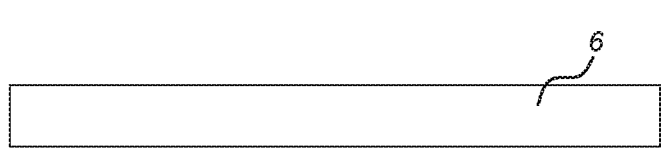
FIG. 5 depicts a schematic diagram of a process flow for manufacturing a 3D power device, according to an example embodiment.

FIG. 5 schematically shows a control layer 6 (in the finished 3D power devices 100, 200, this corresponds to control layers 106, 206), which may be manufactured separately, comprising at least one control device.

Figure 6:
FIG. 6 depicts a schematic diagram of a process flow for manufacturing a 3D power device, according to an example embodiment.

FIG. 6 schematically shows the control layer 6 whereon a third and fourth interlayer 23, 24 (in the finished 3D power devices 100, 200, this corresponds to third interlayers 123, 223 and fourth interlayers 124, 224) is formed on opposite faces of the control layer 6, in particular, the third layer 23 is formed on a lower face of the control layer 6. A third and fourth electrical interconnect 17 (in the finished 3D power device 200, this corresponds to third electrical interconnects 217) may be formed through at least the control layer 6, and in some examples further through the third and fourth interlayers 23, 24. The interconnects 23, 24 may be formed by through-wafer via technology or other known methods.

Figure 7:
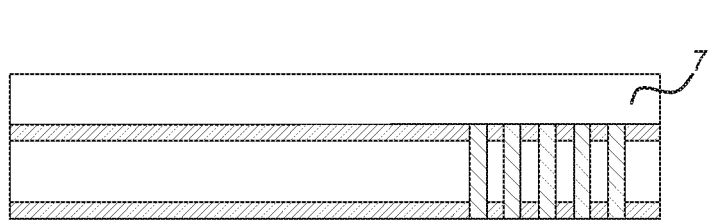
FIG. 7 depicts a schematic diagram of a process flow for manufacturing a 3D power device, according to an example embodiment.

FIG. 7 schematically shows the (optional) step of forming an inductor/transformer layer 7 (in the finished 3D power device 200, this corresponds to inductor/transformer layers 207) on the structure of FIG. 6, such that the fourth interlayer 24 bonds the inductor/transformer layer 7 to the control layer 6. The fourth electrical interconnect may connect to the inductor/transformer layer 7.

Figure 8:
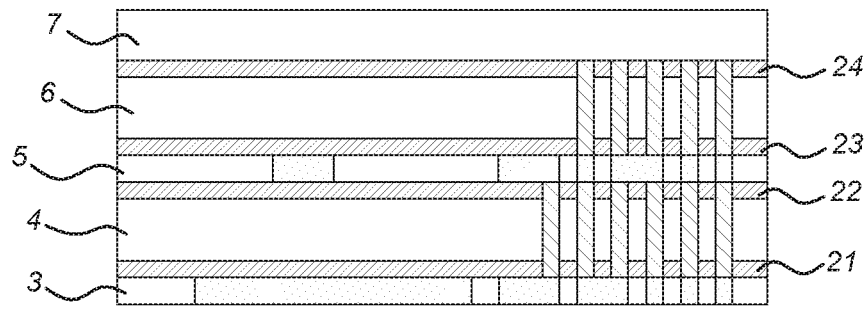
FIG. 8 depicts a schematic diagram of a process flow for manufacturing a 3D power device, according to an example embodiment.

FIG. 8 schematically shows the step of attaching the structure of FIG. 7 on top of the structure of FIG. 4, for example by wafer-to-wafer bonding. In particular, the control layer 6 is provided on the redistribution layer 5, wherein the third interconnect 23 bonds the control layer 6 to the redistribution layer 5. Thus, FIG. 8 shows the lower layer 3, the III-N device layer 4, the redistribution layer 5 and the control layer 6 stacked on top of each other and insulated from each other by interlayers 21-23. As shown, the inductor/transformer layer 7, if present, is further located on top of the control layer 6 and insulated from each other by interlayer 24.

In embodiments of the present disclosure, the structure of FIG. 8 may be directly applied onto a board or carrier, resulting in a structure like the 3D power device of FIG. 11. In other embodiments, a further lower layer may first be provided on the lower layer 3.

Figure 9:
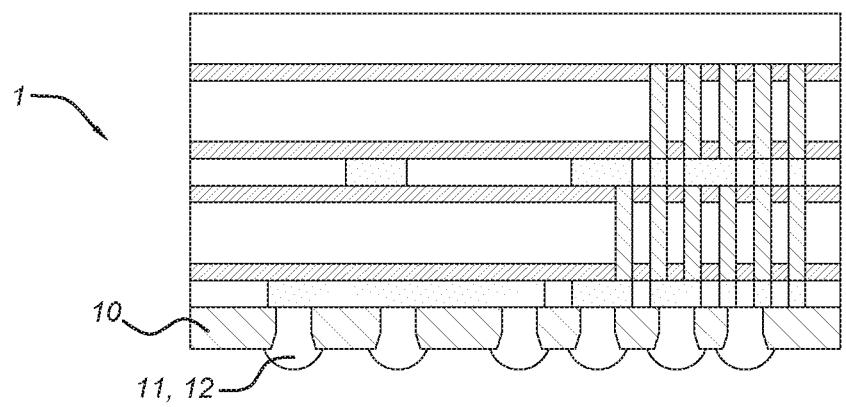
FIG. 9 depicts a schematic diagram of a process flow for manufacturing a 3D power device, according to an example embodiment.

FIG. 9 schematically shows the step of forming such a further lower layer, namely an encapsulation layer 10 (in the finished 3D power device 200, this corresponds to a second part 203b of the lower layer) with electrical and/or thermal interconnects 11, 12 which may be solder bumps, the encapsulation layer being formed around the bumps for protection. The electrical and/or thermal interconnects 11, 12 are connected to the electrical and/or thermal conductive parts of the structure described above.

Figure 10:
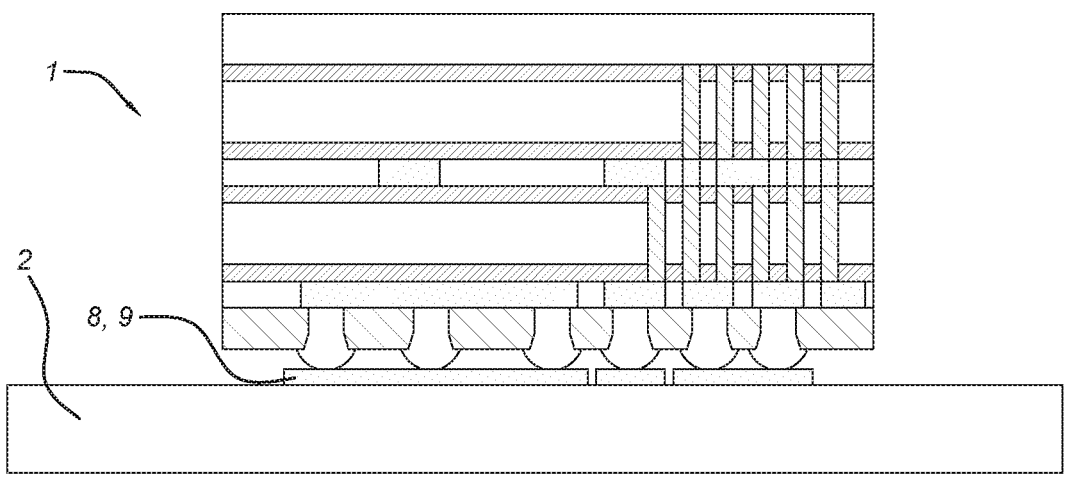
FIG. 10 depicts a schematic diagram of a process flow for manufacturing a 3D power device, according to an example embodiment.

FIG. 10 schematically shows the step of attaching the structure of FIG. 9 to a carrier or board 2, for example by soldering, in particular on top of electrical and thermal conductors or contacts 8, 9 (in the finished 3D power devices 100, 200, this corresponds to electrical conductors or contacts 108, 208 and thermal conductors or contacts 109, 209), respectively for electrical and heat conduction between the 3D power device 1 and the carrier or board 2.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A three-dimensional power device having a plurality of layers that are stacked on top of each other and insulated from each other by interlayers, the plurality of layers comprising:
    a lower layer comprising electrical conductors for conducting electrical currents or signals between the three-dimensional power device and a carrier or board, and thermal conductors configured to conduct heat from the three-dimensional power device to the carrier or board;
    a group III-Nitride based device layer above the lower layer, the group III-Nitride based device layer, comprising at least one group III-Nitride based power device;
    a control layer above the group III-Nitride based device layer, the control layer comprising at least one control device configured to control the at least one group III-Nitride based power device; and
    a current or heat redistribution layer in between the group III-Nitride based device layer and the control layer, the current or heat redistribution layer comprising at least one metal pattern configured to laterally redistribute electrical currents or heat.

2. The three-dimensional power device according to claim 1, wherein the plurality of layers further comprises an inductor layer comprising at least one inductor or transformer.

3. The three-dimensional power device according to claim 2, wherein the inductor layer is integrated in the control layer.

4. The three-dimensional power device according to claim 2, wherein the inductor layer is located above the control layer.

5. The three-dimensional power device according of claim 1, comprising a plurality of electrical interconnects configured to vertically conduct electrical currents and signals through the plurality of layers.

6. The three-dimensional power device according to claim 1, comprising a plurality of thermal interconnects configured to vertically conduct heat through the plurality of layers.

7. The three-dimensional power device according to claim 1, wherein the interlayers comprise at least partially a thermally insulating material.

8. The three-dimensional power device according to claim 1, wherein at least one of the interlayers is a bonding interlayer.

9. The three-dimensional power device according to claim 5, wherein at least one of the interconnects is an interconnect bump.

10. The three-dimensional power device according to claim 5, wherein at least one of the interconnects is a via.

11. The three-dimensional power device according to claim 10, wherein the via is a through-wafer interconnect.

12. The three-dimensional power device according to claim 3, wherein the at least one inductor or transformer are MEMS-based.

13. The three-dimensional power device according to claim 3 wherein the at least one inductor or transformer comprises a ferro-electric material.

14. A three-dimensional power system comprising the at least one three-dimensional power device according to claim 1, wherein the at least one three-dimensional power device is attached to a carrier or board.

15. A process for fabricating a three-dimensional power device comprising:
    providing a carrier or board;
    providing a group III-Nitride based device layer, the group III-Nitride based device layer comprising at least one group III-Nitride based power device;
    forming a lower layer on a face of the group III-Nitride based device layer, the lower layer comprising electrical conductors configured to conduct electrical currents or signals between the three-dimensional power device and the carrier or board and thermal conductors configured to conduct heat from the three-dimensional power device to the carrier or board;
    forming a redistribution layer on a face of the group III-Nitride based device layer opposite the face where the lower layer is formed, the redistribution layer comprising at least one metal pattern configured to laterally redistribute electrical currents and/or heat; and
    forming a control layer above the redistribution layer, the control layer comprising at least one control device for controlling the at least one group III-Nitride based power device;
    wherein interlayers are formed configured to insulate the lower layer, group III-Nitride based device layer, redistribution layer and control layer from each other.

* * * * *